United States Patent
Ishii

(10) Patent No.: US 9,076,836 B2
(45) Date of Patent: Jul. 7, 2015

(54) SEMICONDUCTOR DEVICE

(75) Inventor: Kazufumi Ishii, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 13 days.

(21) Appl. No.: 14/233,410

(22) PCT Filed: Aug. 30, 2011

(86) PCT No.: PCT/JP2011/069630
§ 371 (c)(1),
(2), (4) Date: Jan. 17, 2014

(87) PCT Pub. No.: WO2013/030956
PCT Pub. Date: Mar. 7, 2013

(65) Prior Publication Data
US 2014/0145241 A1    May 29, 2014

(51) Int. Cl.
*H01L 29/66* (2006.01)
*H01L 29/739* (2006.01)
*H02M 7/00* (2006.01)
*H02M 7/487* (2007.01)

(52) U.S. Cl.
CPC .......... *H01L 29/7393* (2013.01); *H02M 7/003* (2013.01); *H02M 7/487* (2013.01)

(58) Field of Classification Search
CPC ... H01L 29/7393; H02M 7/003; H02M 7/487
USPC ........................................................ 257/140
See application file for complete search history.

(56) References Cited

U.S. PATENT DOCUMENTS

| 5,459,655 A | 10/1995 | Mori et al. |
| 5,731,970 A | 3/1998 | Mori et al. |
| 5,801,936 A | 9/1998 | Mori et al. |

(Continued)

FOREIGN PATENT DOCUMENTS

| JP | 5-83947 A | 4/1993 |
| JP | 10-14260 A | 1/1998 |

(Continued)

OTHER PUBLICATIONS

Notification Concerning Transmittal of International Preliminary Report on Patentability (Forms PCT/IB/326, PCT/IB/373 and PCT/IB/338) and the Written Opinion of International Searching Authority (Form PCT/ISA/237) issued on Mar. 4, 2014, by the International Bureau of WIPO in International Application No. PCT/JP2011/069630. (9 pages).

(Continued)

*Primary Examiner* — Victor A Mandala
(74) *Attorney, Agent, or Firm* — Buchanan Ingersoll & Rooney PC

(57) ABSTRACT

The present invention implements an equivalent circuit to a semiconductor device for an upper arm by electrically connecting a terminal for E1C2 and a terminal for K with the use of an external wiring in a semiconductor device. On the other hand, in a semiconductor device including a circuit having the same structure as the semiconductor device, an external wiring is used to electrically connect a terminal for A and a terminal for E1C2. Consequently, there is implemented an equivalent circuit to a semiconductor device for a lower arm which is of a different type from the semiconductor device for the upper arm.

8 Claims, 6 Drawing Sheets

(56) References Cited

U.S. PATENT DOCUMENTS

| | | |
|---|---|---|
| 5,929,519 A | 7/1999 | Mori et al. |
| 5,953,222 A | 9/1999 | Mizutani |
| 6,084,788 A | 7/2000 | Mizutani |
| 2012/0218798 A1* | 8/2012 | Shimada .................. 363/126 |
| 2013/0155740 A1* | 6/2013 | Takubo .................... 363/98 |

FOREIGN PATENT DOCUMENTS

| | | |
|---|---|---|
| JP | 10-285950 A | 10/1998 |
| JP | 2003-303939 A | 10/2003 |
| JP | 2009-55664 A | 3/2009 |

OTHER PUBLICATIONS

International Search Report (PCT/ISA/210) mailed on Dec. 6, 2011, by the Japanese Patent Office as the International Searching Authority for International Application No. PCT/JP2011/069630.

* cited by examiner (a)

(b)

F I G . 4
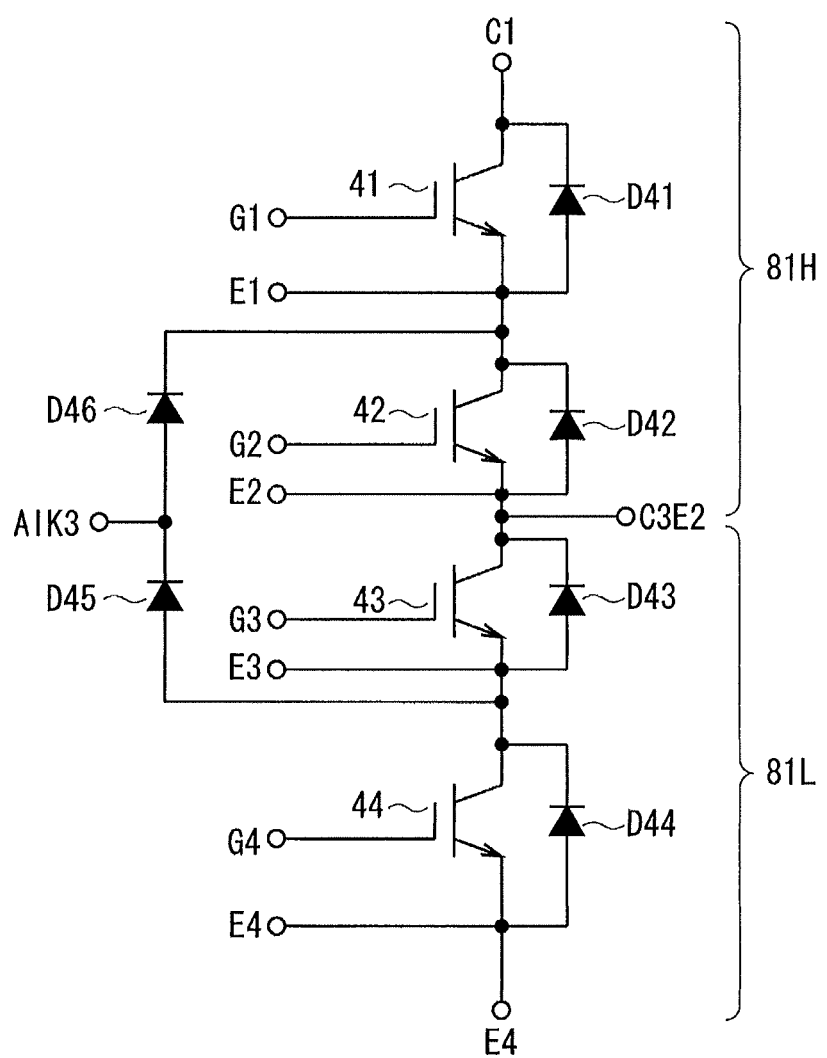

F I G. 5
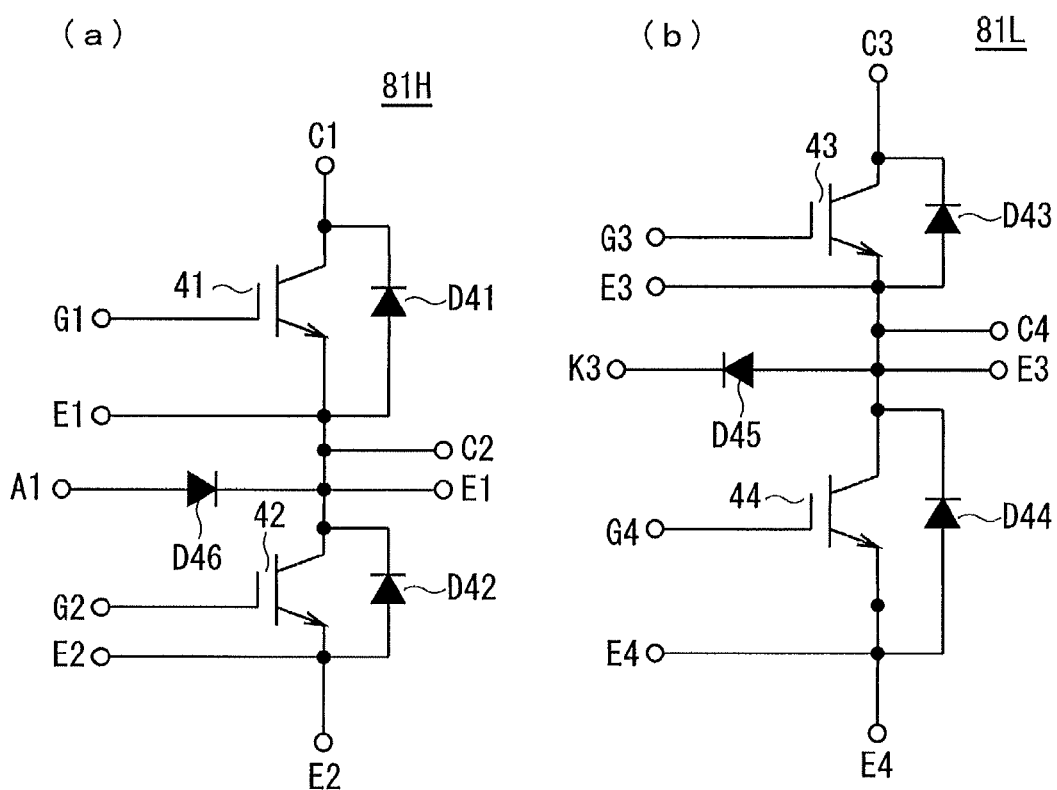

SEMICONDUCTOR DEVICE

TECHNICAL FIELD

The present invention relates to a semiconductor device including, in a case, a circuit constituted by connecting a plurality of self arc-extinguishing elements in series.

BACKGROUND ART

Conventionally, a semiconductor device constituted by a self arc-extinguishing element such as an IGBT generally has a structure in which a circuit is accommodated in a case. A semiconductor device (a switching module) constituted by connecting the self arc-extinguishing elements in series is disclosed in Patent Document 1, for example.

By using the semiconductor device, for example, when each phase in a semiconductor device for an NPC (Neutral-Point-Clamped) type 3-level inverter is to be constituted by two semiconductor devices, two kinds of semiconductor devices which are different for an upper arm and a lower arm are required as components.

PRIOR ART DOCUMENT

Patent Document

Patent Document 1: Japanese Patent Application Laid-Open No. 10-14260 (1998)

SUMMARY OF THE INVENTION

Problems to be Solved by the Invention

As described above, in the case in which a single phase portion of the NPC type 3-level inverter is constituted by the semiconductor device for the upper arm and the semiconductor device for the lower arm, two kinds of semiconductor devices are required and there is a problem in that the semiconductor device might be attached by mistake in assembly. In the case in which a countermeasure such as change in a surface color of a semiconductor device for each kind is taken as a countermeasure for preventing the erroneous attachment, moreover, there is a problem in that a special step is excessively required for the countermeasure in a process for manufacturing the semiconductor device.

It is an object of the present invention to solve the problems described above and to obtain a semiconductor device with versatility in which plural kinds of circuits can be implemented selectively by a single device in the case in which circuit components of the semiconductor device are the same and a connection relationship is partially different, for example, the case in which a single phase portion of an NPC type 3-level inverter is constituted by a semiconductor device for an upper arm and a semiconductor device for a lower arm, or the like.

Means for Solving the Problems

The semiconductor device according to the present invention includes first and second self arc-extinguishing elements to be connected in series, first and second diodes having cathodes connected to first electrodes of the first and second self arc-extinguishing elements and anodes connected to second electrodes, a third diode, and a case for accommodating the first and second self arc-extinguishing elements and the first to third diodes, and the third diode is insulated from all of the first and second self arc-extinguishing elements and the first and second diodes in the case.

Effects of the Invention

The third diode in the first aspect of the present invention is insulated from all of the first and second self arc-extinguishing elements and the first and second diodes (which will be hereinafter referred to as "two sets of self arc-extinguishing element group). Therefore, there is no electrical connection relationship between the third diode and the two sets of self arc-extinguishing element groups in an in-case accommodating state.

Accordingly, the electrical connection relationship between the third diode and the two sets of self arc-extinguishing element groups is set by using the external wiring on the outside of the case, and plural kinds of electrical connection relationships are maintained between the third diode and the two sets of self arc-extinguishing element groups. Consequently, it is possible to implement plural kinds of circuits as a combinational circuit of the two sets of self arc-extinguishing element groups and the third diode. As a result, it is possible to produce an effect that a semiconductor device with versatility can be obtained.

These and other objects, features, aspects and advantages of the present invention will become more apparent from the following detailed description of the present invention when taken in conjunction with the accompanying drawings.

BRIEF DESCRIPTION OF DRAWINGS

FIG. 4 is a circuit diagram showing a circuit structure corresponding to a single phase portion of an NPC type 3-level inverter to be a technical premise.

FIG. 5 is a circuit diagram showing a circuit structure of each of a semiconductor device for an upper arm and a semiconductor device for a lower arm illustrated in FIG. 4.

EMBODIMENT FOR CARRYING OUT THE INVENTION

<Technical Premise>

Figure 1:
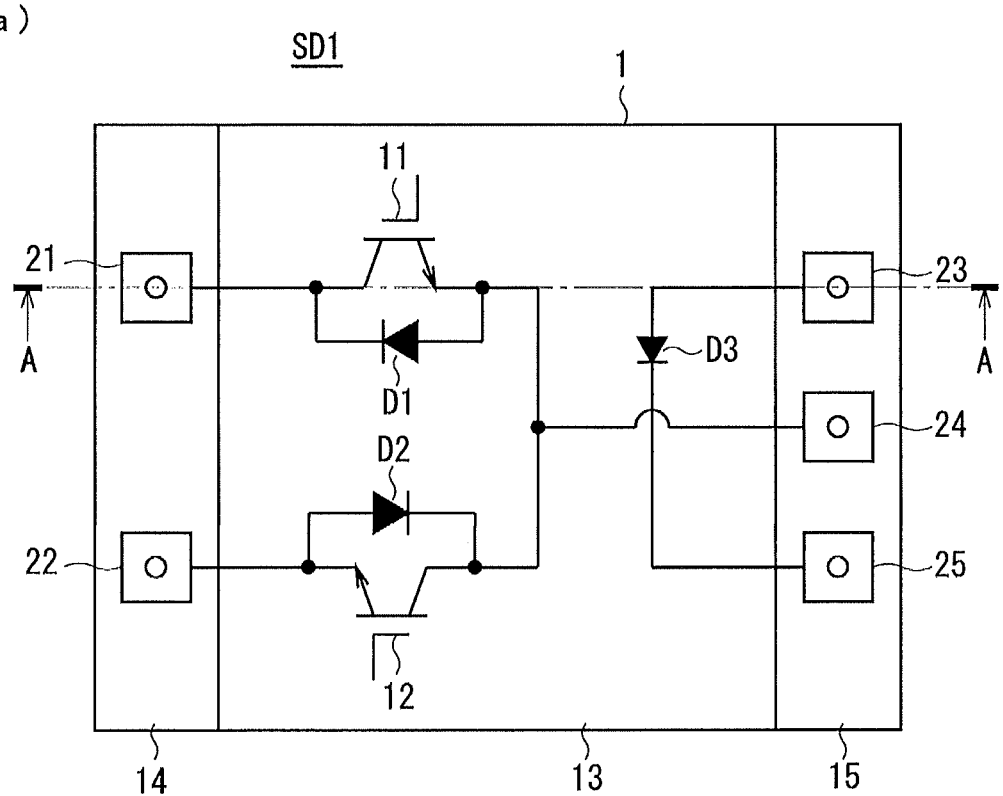
FIG. 1 is an explanatory diagram schematically showing a circuit structure of a semiconductor device according to a first embodiment together with an external terminal.
Figure 1:
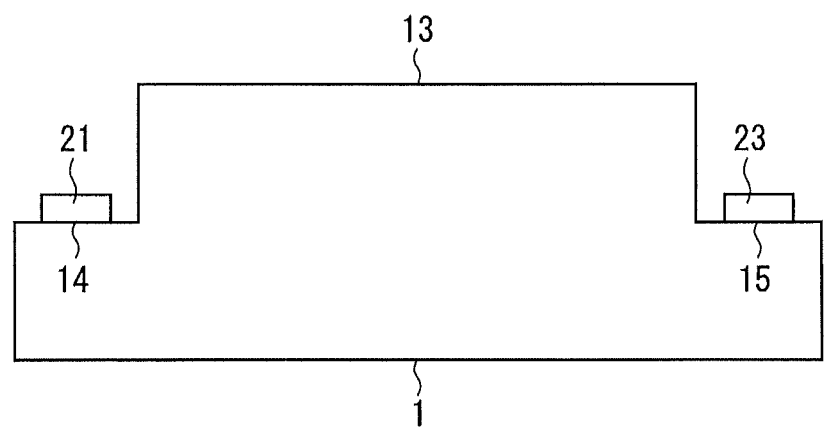

FIG. 4 is a circuit diagram showing a circuit structure corresponding to a single phase portion of a conventional NPC type 3-level inverter. As shown in FIG. 4, the inverter corresponding to the single phase portion is constituted by a semiconductor device 81H for an upper arm and a semiconductor device 81L for a lower arm.

FIG. 5 is a circuit diagram showing respective circuit structures of the semiconductor device 81H for the upper arm and the semiconductor device 81L for the lower arm. As shown in part (a) of FIG. 5, the semiconductor device 81H for the upper arm is constituted by IGBTs 41 and 42 and diodes D41, D42 and D46.

The IGBT 41 has a collector connected to a collector terminal C1, an emitter connected to an emitter terminal E1, and a gate connected to a gate terminal G1. The diode D41 has an anode connected to the emitter of the IGBT 41 and a cathode connected to the collector of the IGBT 41. In other words, the diode D41 is connected to the IGBT 41 in reverse parallel.

The IGBT 42 has a collector connected to a collector terminal C2, an emitter connected to an emitter terminal E2, and a gate connected to a gate terminal G2. The diode D42 has an anode connected to the emitter of the IGBT 42 and a cathode connected to the collector of the IGBT 42. In other words, the diode D42 is connected to the IGBT 42 in reverse parallel.

Furthermore, the emitter terminal C1 on the IGBT 41 side and the collector terminal C2 on the IGBT 42 side are connected to each other so that the IGBT 41 and the IGBT 42 are connected in series.

The diode D46 has an anode connected to an anode terminal A1 and a cathode connected to the collector terminal C2 and the emitter terminal E1.

On the other hand, as shown in part (b) of FIG. 5, the semiconductor device 81L for the lower arm is constituted by IGBTs 43 and 44 and diodes D43, D44 and D45.

The IGBT 43 has a collector connected to a collector terminal C3, an emitter connected to an emitter terminal E3, and a gate connected to a gate terminal G3. The diode D43 has an anode connected to the emitter of the IGBT 43 and a cathode connected to the collector of the IGBT 43. In other words, the diode D43 is connected to the IGBT 43 in reverse parallel.

The IGBT 44 has a collector connected to a collector terminal C4, an emitter connected to an emitter terminal E4, and a gate connected to a gate terminal G4. The diode D44 has an anode connected to the emitter of the IGBT 44 and a cathode connected to the collector of the IGBT 44. In other words, the diode D44 is connected to the IGBT 44 in reverse parallel.

Furthermore, the emitter terminal C3 on the IGBT 43 side and the collector terminal C4 on the IGBT 44 side are connected to each other so that the IGBT 43 and the IGBT 44 are connected in series.

The diode D45 has a cathode connected to a cathode terminal K3 and an anode connected to the collector terminal C4 and the emitter terminal E3.

By combining the semiconductor device 81H for the upper arm and the semiconductor device 81L for the lower arm shown in FIG. 5, it is possible to constitute an inverter corresponding to a single phase portion as illustrated in FIG. 4.

In other words, electrical connection to the anode terminal A1 of the semiconductor device 81H for the upper arm is carried out by using an external wiring or the like in the following manner.

(a) The emitter terminal E2 of the semiconductor device 81H for the upper arm and the collector terminal C3 of the semiconductor device 81L for the lower arm are electrically connected to each other (in the drawing, a collector-emitter terminal is indicated as C3E2).

(b) The anode terminal A1 of the semiconductor device 81H for the upper arm and the cathode terminal K3 of the semiconductor device 81L for the lower arm are electrically connected to each other (in the drawing, an anode-cathode terminal is indicated as A1K3).

Figure 6:
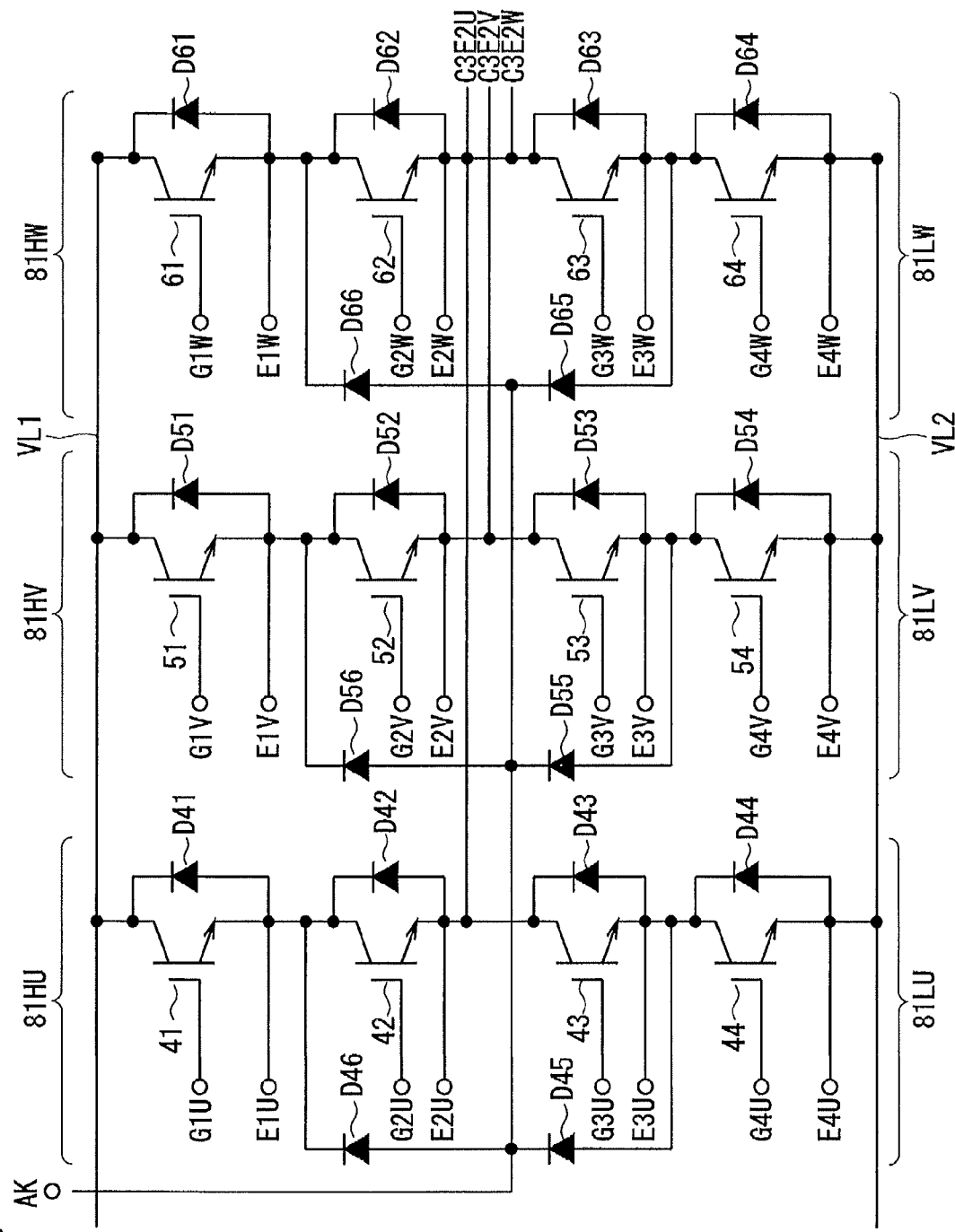
FIG. 6 is a circuit diagram showing a circuit structure of a 3-phase 3-level inverter.

FIG. 6 is a circuit diagram showing a circuit structure of a 3-phase (a U phase, a V phase, a W phase) 3-level (three voltage levels) inverter. As shown in FIG. 6, an inverter for the U phase is constituted by a semiconductor device 81HU for an upper arm and a semiconductor device 81LU for a lower arm and has the same structure and connection configuration as the semiconductor device 81H for the upper arm and the semiconductor device 81L for the lower arm illustrated in FIG. 4.

In the semiconductor device 81HU for the upper arm and the semiconductor device 81LU for the lower arm, G1U to G4U and E1U to E4U are indicated as gate terminals and emitter terminals of IGBTs 41 to 44. Moreover, an anode-cathode terminal AK is indicated as a connecting terminal of the cathode of the diode D45 and an anode of the diode D46.

An inverter for the V phase is constituted by a semiconductor device 81HV for an upper arm and a semiconductor device 81LV for a lower arm, and has the same structure and connection configuration as the semiconductor device 81H for the upper arm and the semiconductor device 81L for the lower arm illustrated in FIG. 4. However, there is a difference in that IGBTs 51 to 54 correspond to the IGBTs 41 to 44 in FIG. 4 and diodes D51 to D56 correspond to the diodes D41 to D46 in FIG. 4.

In the semiconductor device 81HV for the upper arm and the semiconductor device 81LV for the lower arm, G1V to G4V and E1V to E4V are indicated as gate terminals and emitter terminals in the IGBTs 51 to 54. Moreover, the anode-cathode terminal AK is indicated as a connecting terminal of a cathode of the diode D55 and an anode of the diode D56.

An inverter for the W phase is constituted by a semiconductor device 81HW for an upper arm and a semiconductor device 81LW for a lower arm, and has the same structure and connection configuration as the semiconductor device 81H for the upper arm and the semiconductor device 81L for the lower arm illustrated in FIG. 4. However, there is a difference in that IGBTs 61 to 64 correspond to the IGBTs 41 to 44 in FIG. 4 and diodes D61 to D66 correspond to the diodes D41 to D46 in FIG. 4.

In the semiconductor device 81HW for the upper arm and the semiconductor device 81LW for the lower arm, G1W to G4W and E1W to E4W are indicated as gate terminals and emitter terminals of the IGBTs 61 to 64. Moreover, the anode-cathode terminal AK is indicated as a connecting terminal of a cathode of the diode D65 and an anode of the diode D66.

The anode-cathode terminal AK is used in common to the U phase, the V phase and the W phase, and a collector-emitter terminal C3E2U to which the emitter terminal of the semiconductor device 81HU for the upper arm and the collector terminal of the semiconductor device 81LU for the lower arm are electrically connected serves as an output terminal for the U phase.

Similarly, a collector-emitter terminal C3E2V to which the emitter terminal of the semiconductor device 81HV for the upper arm and the collector terminal of the semiconductor device 81LV for the lower arm are electrically connected serves as an output terminal for the V phase, and a collector-emitter terminal C3E2W to which the emitter terminal of the semiconductor device 81HW for the upper arm and the collector terminal of the semiconductor device 81LW for the lower arm are electrically connected serves as an output terminal for the W phase.

Moreover, the collectors of the IGBT 41, the IGBT 51 and the IGBT 61 are connected to a first power line VL1 in common, and the emitters of the IGBT 44, the IGBT 54 and the IGBT 64 are connected to a second power line VL2 in common. For example, a positive source voltage and a grounding level are given to the first power line VL1 and the second power line VL2.

In the case in which the three-level inverter is constituted, thus, it is necessary to prepare two kinds of semiconductor devices, that is, the semiconductor device 81H (81HU, 81HV, 81HW) for the upper arm and the semiconductor device 81L (81LU, 81LV, 81LW) for the lower arm.

For this reason, there is a problem in that the semiconductor device 81H for the upper arm and the semiconductor device 81L for the lower arm are attached by mistake in the assembly of the 3-level inverter.

In the case in which a color of a case is varied in the semiconductor device 81H for the upper arm and the semiconductor device 81L for the lower arm as a countermeasure to be taken against the problem, there is a problem in that a special step of applying a different color is required in a process for manufacturing a semiconductor device, resulting in increase in a manufacturing cost.

Embodiments which will be described below provide a semiconductor device with versatility in which the semiconductor device 81H for the upper arm and the semiconductor device 81L for the lower arm can be implemented selectively by a single device.

First Embodiment

FIG. 1 is an explanatory diagram schematically showing a circuit structure of a semiconductor device according to a first embodiment together with an external terminal. Part (a) of FIG. 1 shows a planar structure of a case and an internal circuit and part (b) of FIG. 1 shows an A-A section of part (a) of FIG. 1.

As shown in FIG. 1, a semiconductor device SD1 according to the first embodiment is constituted by N-type IGBTs 11 and 12 and diodes D1 to D3 which are provided on a central part 13 in a case 1 and external terminals 21 to 25 provided on a step portion 14 and a step portion 15 at an outside of the case 1.

A collector (a first electrode) of the IGBT 11 is connected to the terminal 21 for C1 (a collector) (a terminal for a first electrode), and the diode D1 has an anode connected to an emitter of the IGBT 11 and a cathode connected to the collector of the IGBT 11. In other words, the diode D1 is connected to the IGBT 11 in reverse parallel.

An emitter (a second electrode) of the IGBT 12 is connected to the terminal 22 for E2 (an emitter) (a terminal for a second electrode), and the diode D2 has an anode connected to the emitter of the IGBT 12 and a cathode connected to a collector (a first electrode) of the IGBT 12. In other words, the diode D2 is connected to the IGBT 12 in reverse parallel.

Furthermore, the emitter on the IGBT 11 side and the collector of the IGBT 12 are connected to each other and are connected to the terminal 24 for E1C2 (a terminal for a common electrode). In other words, the IGBT 11 and the IGBT 12 are connected in series.

The diode D3 has an anode connected to the terminal 23 for A (a terminal for the anode) and a cathode connected to the terminal 25 for K (a terminal for the cathode).

The diode D3 maintains an insulation relationship with all of the IGBT 11 and the IGBT 12 and the diodes D1 and D2 in the case 1.

All of the external terminals 21 to 25 are provided on the outside of the case 1 and an external wiring can be connected thereto. The terminal 21 for C1 and the terminal 22 for E2 are provided on the step portion 14 serving as a vicinal region of a left side seen on a plane of the case 1, and the terminal 23 for A, the terminal 24 for E1C2 and the terminal 25 for K are provided on the step portion 15 serving as a vicinal region of a right side seen on the plane of the case 1.

Figure 2:
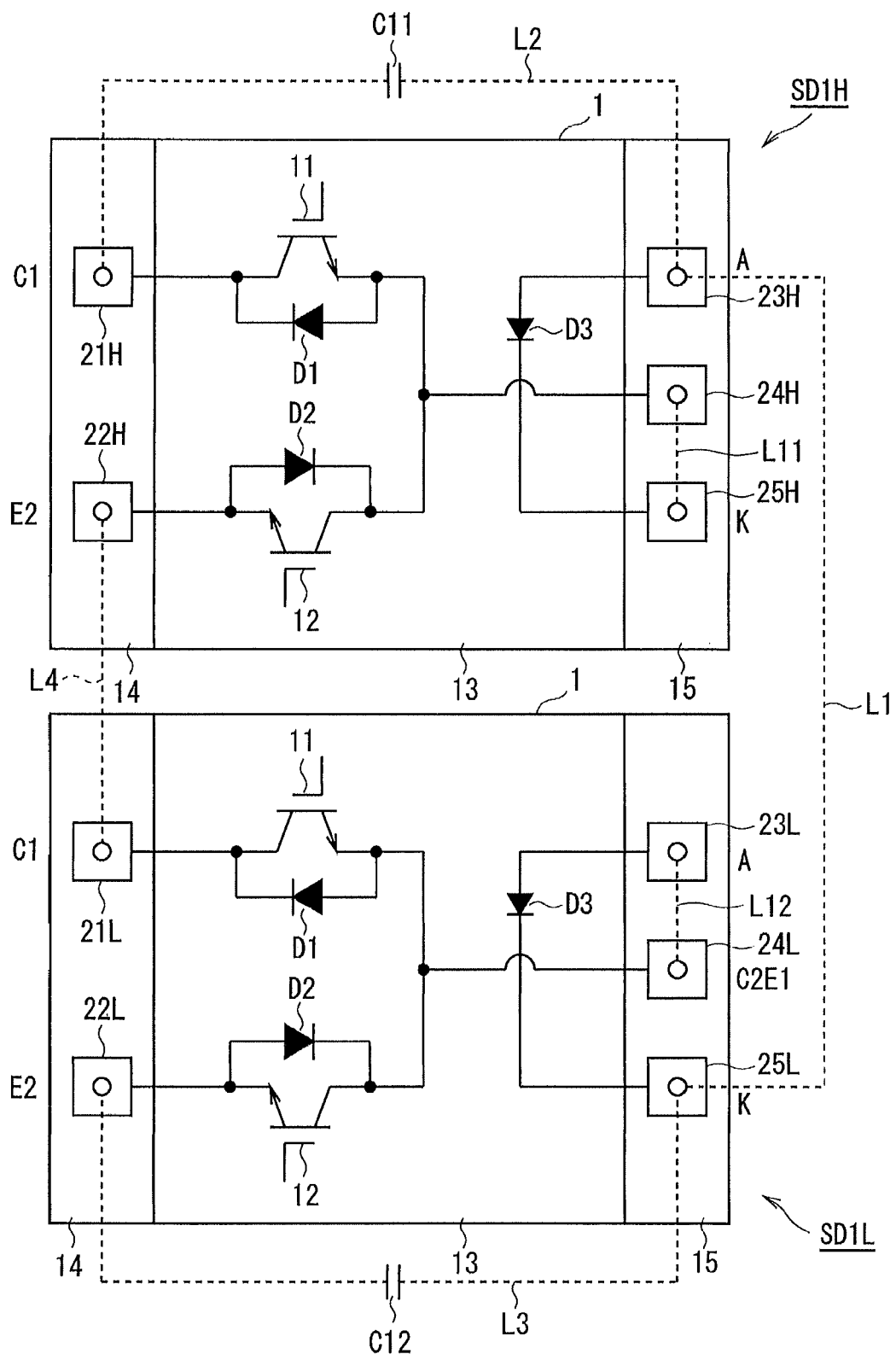
FIG. 2 is an explanatory diagram schematically showing an example of external wiring connection in the case in which two semiconductor devices according to the first embodiment illustrated in FIG. 1 are used to constitute a single phase portion of a 3-level inverter.

FIG. 2 is an explanatory diagram schematically showing an example of external wiring connection in the case in which two semiconductor devices SD1 according to the first embodiment illustrated in FIG. 1 are used to constitute a single phase portion of the 3-level inverter. In FIG. 2, a semiconductor device SD1H and a semiconductor device SD1L which include a circuit in the case 1 having the same structure as the semiconductor device SD1 respectively are connected by using external wirings L1 to L4 and external wirings L11 and L12. Specific connection will be carried out below. For convenience of explanation, external terminals on the semiconductor device SD side are represented as terminals 21H to 25H and external terminals on the semiconductor device SD1L side are represented as terminals 21L to 25L.

As shown in FIG. 2, in the semiconductor device SD1H, the external wiring L11 is used to electrically connect the terminal 24H for E1C2 and the terminal 25H for K so that the emitter of the IGBT 11 and the collector of the IGBT 12 can be electrically connected to the cathode of the diode D3. As a result, it is possible to implement an equivalent circuit to the semiconductor device 81H for the upper arm shown in part (a) of FIG. 5.

On the other hand, in the semiconductor device SD1L, the terminal 23L for A and the terminal 24 for E1C2 are electrically connected to each other by using the external wiring L12 so that the emitter of the IGBT 11 and the collector of the IGBT 12 can be electrically connected to the anode of the diode D3. As a result, it is possible to implement an equivalent circuit to the semiconductor device 81L for the lower arm shown in part (b) of FIG. 5.

In the first embodiment, thus, by varying the connection relationship among the terminal 23 for A, the terminal 24 for E1C2 and the terminal 25 for K with the circuit structure in the case 1 using the same semiconductor device SD1 (SD1H, SDL1), it is possible to selectively implement an equivalent semiconductor device to the semiconductor device 81H for the upper arm and the semiconductor device 81L for the lower arm.

In order to connect the semiconductor device SD1H to the semiconductor device SD1L, the terminal 23H for A and the terminal 25L for K are electrically connected to each other by using the external wiring L1 and the terminal 22H for E2 and the terminal 21L for C1 are electrically connected to each other by using the external wiring L4.

Moreover, the external wiring L2 for inserting a capacitor C11 for a power supply is provided between the terminal 21H for C1 and the terminal 23H for A in the semiconductor device SD1H, and the external wiring L3 for inserting a capacitor 12 for a power supply is provided between the terminal 22L for E2 and the terminal 25L for K in the semiconductor device SD1L. These external wirings L2 and L3 are provided in series between first and second power lines VL1 and VL2 shown in FIG. 6, for example.

The diode D3 (a third diode) in the semiconductor device SD1 (SD1H, SD1L) according to the first embodiment is insulated from all of the IGBTs 11 and 12 (first and second self arc-extinguishing elements) and the diodes D1 and D2 (which will be hereinafter referred to as "two sets of self arc-extinguishing element group). For this reason, there is no electrical connection relationship between the diode D3 and the two sets of self arc-extinguishing element groups in an accommodating state in the case 1.

By setting the electrical connection relationship between the diode D3 and the two sets of self arc-extinguishing element groups with the use of the external wirings L11 and L12 on the outside of the case 1 and maintaining two kinds of electrical connection relationships between the diode D3 and the two sets of self arc-extinguishing element groups, accordingly, it is possible to implement two kinds of circuits (corresponding to the semiconductor device 81H for the upper arm and the semiconductor device 81L for the lower arm) as a combinational circuit of the two sets of self arc-extinguishing element groups and the diode D3. As a result, it is possible to produce an effect that a semiconductor device with versatility can be obtained.

Specifically, it is possible to obtain a first combinational circuit corresponding to the semiconductor device 81H for the upper arm in which the terminal 24H for E1C2 (the terminal for the common electrode) and the terminal 25H for K (the terminal for the cathode) are electrically connected to each other through the external wiring L11 so that the emitter (the second electrode) of the IGBT 11 and the collector (the first electrode) of the IGBT 12 are electrically connected to the cathode of the diode D3.

On the other hand, it is possible to obtain a second combinational circuit corresponding to the semiconductor device 81L for the lower arm in which the terminal 24L for E1C2 and the terminal 23L for A are electrically connected to each other through the external wiring L12 so that the emitter of the IGBT 11 and the collector of the IGBT 12 are electrically connected to the anode of the diode D3.

As a result, referring to the semiconductor device SD1 according to the first embodiment, the way for using the external wiring (either of the external wirings L11 and L12 is employed) is changed to implement the first and second combinational circuits. Consequently, it is possible to produce an effect that a semiconductor device with versatility including the IGBT can be obtained.

First and second places (on the step portion 14) where the terminal 21 for C1 and the terminal 22 for E2 are to be formed and third to fifth places (on the step portion 15) where the terminal 23 for A, the terminal 24 for E1C2 and the terminal 25 for K are to be formed are disposed in vicinal regions of different sides from each other (the terminals 21 and 22 are disposed on the step portion 14 in the vicinity of a left side seen on a plane of the case 1 and the terminals 23 and 24 are disposed on the step portion 15 in the vicinity of a right side seen on the plane of the case 1). Therefore, the external wiring L4 for the IGBTs 11 and 12 and the external wiring L1 for the diode D3 can be separated and formed comparatively easily.

Moreover, the step portion 14 and the step portion 15 are present in the vicinal regions of opposed sides to each other. Therefore, it is possible to separate and form the external wiring L4 for the IGBTs 11 and 12 and the external wiring L1 for the diode D3 more reliably without crossing.

In the semiconductor device SD1, furthermore, the first place (where the terminal 21 for C1 is to be disposed) and the fourth place (where the terminal 23 for A is to be disposed) each include a comparatively close place to the upper side in the drawing, and the second place (where the terminal 22 for E2 is to be disposed) and the fifth place (where the terminal 25 for K is to be disposed) each include a comparatively close place to the lower side (opposed to the upper side) in the drawing. In other words, the terminal 21 for C1 and the terminal 23 for A are provided on the upper side seen on the plane of the case 1, and the terminal 22 for E2 and the terminal 25 for K are provided on the lower side seen on the plane of the case 1.

By using the external wirings L2 and L3 having comparatively small wiring lengths, therefore, it is possible to provide the capacitors C11 and C12 for a power supply (the first and second capacitors for a power supply) between the terminal 21 for C1 and the terminal 23 for A and between the terminal 22 for E2 and the terminal 25 for K, respectively. Consequently, it is possible to reduce inductances of the external wirings L2 and L3. Thus, it is possible to produce an effect that a surge voltage in turn-off switching of the IGBTs 11 and 12 can be reduced.

Second Embodiment

Figure 3:
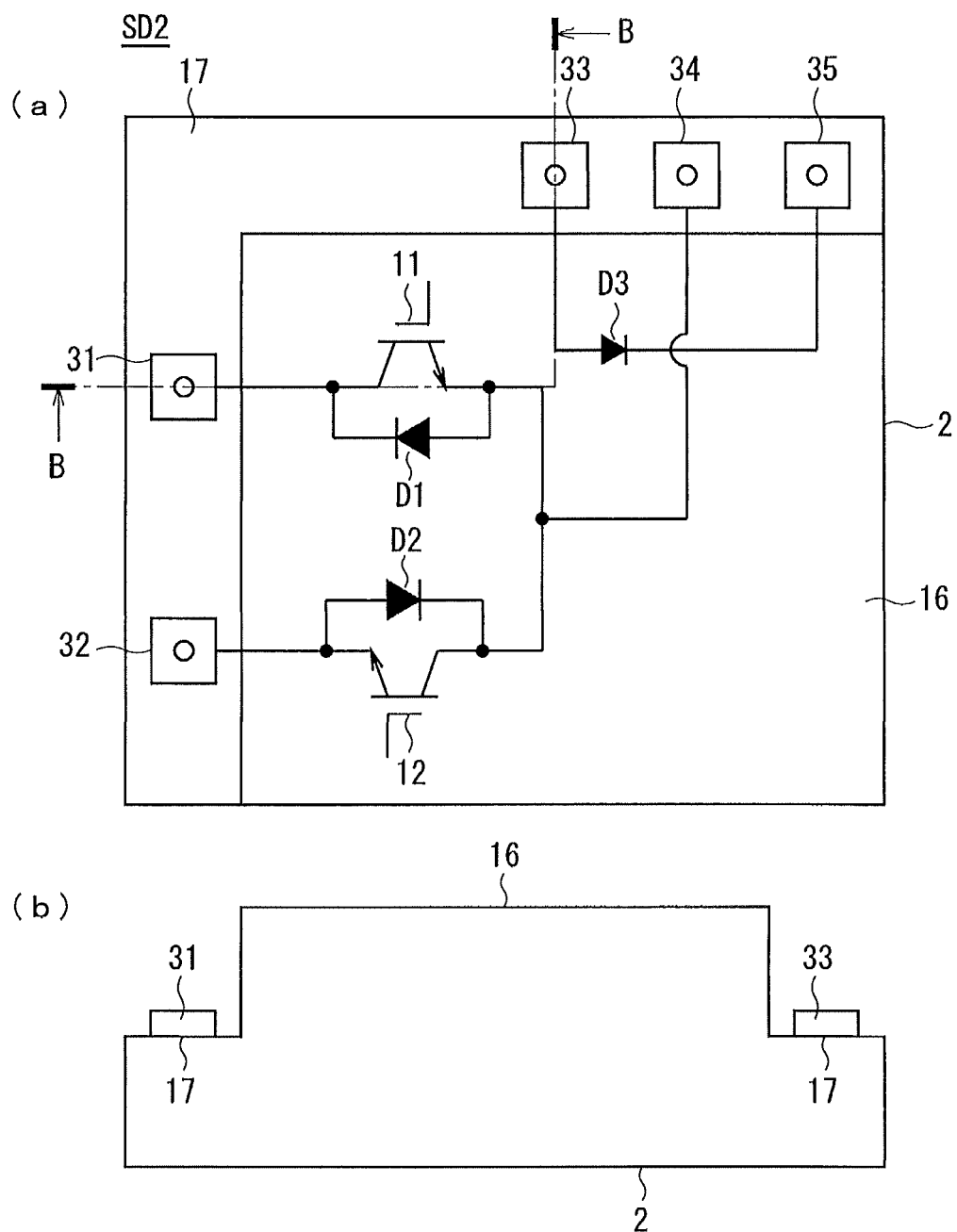
FIG. 3 is an explanatory diagram schematically showing a circuit structure of a semiconductor device according to a second embodiment together with an external terminal.

FIG. 3 is an explanatory diagram schematically showing a circuit structure of a semiconductor device according to a second embodiment together with an external terminal. Part (a) of FIG. 3 shows a planar structure of a case and an internal circuit and part (b) of FIG. 3 shows an irregular B-B section of part (a) of FIG. 3.

As shown in FIG. 3, a semiconductor device SD2 according to the second embodiment is constituted by IGBTs 11 and 12 and diodes D1 to D3 which are provided on a main part 16 in a case 2 and external terminals 31 to 35 provided on a step portion 17 at an outside of the case 2.

A collector of the IGBT 11 is connected to the terminal 31 for C1 (a collector) and the diode D1 is connected to the IGBT 11 in reverse parallel. An emitter of the IGBT 12 is connected to a terminal 32 for E2 (an emitter) and the diode D2 is connected to the IGBT 12 in reverse parallel.

Furthermore, an emitter on the IGBT 11 side and a collector of the IGBT 12 are connected to each other and are connected to the terminal 34 for E1C2. In other words, the IGBT 11 and the IGBT 12 are connected in series.

The diode D3 has an anode connected to a terminal 33 for A and a cathode connected to a terminal 35 for K. In the same manner as in the first embodiment, the diode D3 maintains an insulation relationship with all of the IGBT 11 and the IGBT 12 and the diodes D1 and D2 in the case 2.

All of the external terminals 31 to 35 are provided on the outside of the case 2 and an external wiring can be connected thereto. All of the external terminals 31 to 35 are formed on the step portion 17 provided on a left side and an upper side seen on a plane of the case 2. In other words, the terminal 31 for C1 and the terminal 32 for E2 are provided on the vicinal region of the left side seen on the plane of the case 2 in the step portion 17, and the terminal 33 for A, the terminal 34 for E1C2 and the terminal 35 for K are provided on the vicinal region of a right side seen on the plane of the case 2 in the step portion 17.

It is possible to constitute a single phase portion of a 3-level inverter by using two semiconductor devices SD2 according to the second embodiment. A content of connection is substantially identical to the content of the connection through the two semiconductor devices SD1 (SD1H, SD1L) according to the first embodiment shown in FIG. 2. In other words, by replacing the external terminals 21 to 25 (21H to 25H, 21L to 25L) in FIG. 2 with the external terminals 31 to 35 (31H to 35H, 31L to 35L) and providing external wirings L1 to L4, L11 and L12 and capacitors C11 and C12 for a power supply in the same manner as in FIG. 2, it is possible to constitute a single phase portion of a 3-level inverter which is equivalent to that in FIG. 2.

In the second embodiment, thus, it is possible to selectively implement an equivalent semiconductor device to the semiconductor device 81H for the upper arm and the semiconductor device 81L for the lower arm by varying a connection relationship among the terminal 33 for A, the terminal 34 for E1C2 and the terminal 35 for K with the use of the identical semiconductor device SD2 in the same manner as in the first embodiment.

The diode D3 in the semiconductor device SD2 according to the second embodiment is insulated from all of the IGBTs 11 and 12 and the diodes D1 and D2 (which will be hereinafter abbreviated to "two sets of self arc-extinguishing element groups"). For this reason, there is no electrical connection relationship between the diode D3 and the two sets of self arc-extinguishing element groups in an accommodating state in the case 2.

By setting the electrical connection relationship between the diode D3 and the two sets of self arc-extinguishing element groups with the use of (equivalent wirings to) the external wirings L11 and L12 on the outside of the case 2 and maintaining two kinds of electrical connection relationships between the diode D3 and the two sets of self arc-extinguishing element groups, accordingly, it is possible to implement two kinds of circuits (corresponding to the semiconductor device 81H for the upper arm and the semiconductor device 81L for the lower arm) as a combinational circuit of the two sets of self arc-extinguishing element groups and the diode D3. As a result, the semiconductor device SD2 according to the second embodiment can produce an effect that a semiconductor device with versatility can be obtained in the same manner as in the first embodiment.

First and second places where the terminal 31 for C1 and the terminal 32 for E2 are to be formed (the vicinal region of the left side seen on the plane of the case 2 in the step portion 17) and third to fifth places where the terminal 33 for A, the terminal 34 for E1C2 and the terminal 35 for K are to be formed (the vicinal region of the upper side seen on the plane of the case 2 in the step portion 17) have an adjacent relationship to each other and are vicinal regions of the different sides. Therefore, it is possible to separate and form the external wiring L4 for the IGBTs 11 and 12 and the external wiring L1 for the diode D3 comparatively easily.

Although the IGBT is used as the self arc-extinguishing element in the first embodiment and the second embodiment, it is also possible to use an FET (field effect transistor) represented by an MOSFET. In the case in which the FET is used, it is also possible to utilize a parasitic diode between a body and a drain in the FET as the diodes D1 and D2 (see FIGS. 1 to 3).

For example, with the structure according to the first embodiment shown in FIG. 1, it is possible to suppose a variant in which N-type first and second FETs are used in place of the N-type IGBTs 11 and 12. In this case, the first FET has a drain electrode (a first electrode) connected to a terminal corresponding to the terminal 21 for C1, and the diode D1 has an anode connected to a source electrode (a second electrode) of the first FET and a cathode connected to the drain electrode of the first FET.

The second FET has a source electrode (a second electrode) connected to a terminal corresponding to the terminal 22 for E2, and the diode D2 has an anode connected to the source electrode of the second FET and a cathode connected to a drain electrode (a first electrode) of the second FET.

In the variant of the semiconductor device including the first and second FETs as described above, the way for using the external wiring is changed to implement the first and second combinational circuits in the same manner as in the first embodiment and the second embodiment. Consequently, it is possible to produce an effect that a semiconductor device with versatility including an FET as a self arc-extinguishing element can be obtained.

While the invention has been described in detail, the foregoing description is in all aspects illustrative and not restrictive. It is therefore understood that numerous variants which are not illustrated can be devised without departing from the scope of the invention.

The invention claimed is:

1. A semiconductor device comprising:
   first and second self arc-extinguishing elements to be connected in series;
   first and second diodes having cathodes connected to first electrodes of said first and second self arc-extinguishing elements and anodes connected to second electrodes of said first and second self arc-extinguishing elements;
   a third diode; and
   a case for accommodating said first and second self arc-extinguishing elements and said first to third diodes,
   wherein said third diode is insulated from all of said first and second self arc-extinguishing elements and said first and second diodes in said case.

2. The semiconductor device according to claim 1, further comprising:
   a terminal for a first electrode which is electrically connected to said first electrode of said first self arc-extinguishing element and is disposed to be connectable to an external wiring in a first place on an outside of said case;
   a terminal for a second electrode which is electrically connected to said second electrode of said second self arc-extinguishing element and is disposed to be connectable to an external wiring in a second place on the outside of said case;
   a terminal for a common electrode which is electrically connected to said second electrode of said first self arc-extinguishing element and said first electrode of said second self arc-extinguishing element, and is disposed to be connectable to an external wiring in a third place on the outside of said case;
   a terminal for an anode which is electrically connected to an anode of said third diode and is disposed to be connectable to an external wiring in a fourth place on the outside of said case; and
   a terminal for a cathode which is electrically connected to a cathode of said third diode and is disposed to be connectable to an external wiring in a fifth place on the outside of said case.

3. The semiconductor device according to claim 2, wherein
   said case includes a rectangular case having four sides as seen on a plane,
   said first and second places each include a region portion in the vicinity of a first side to be a predetermined side of said case as seen on a plane, and
   said third to fifth places each include a region portion in the vicinity of a second side which is different from said first side as seen on a plane.

4. The semiconductor device according to claim 3, wherein said first and second sides include sides which are opposed to each other.

5. The semiconductor device according to claim 4, wherein
   a capacitor for a first power supply can be connected between said terminal for the first electrode and said terminal for the anode,
   a capacitor for a second power supply can be connected between said terminal for the second electrode and said terminal for the cathode,
   said first place and said fourth place each include a comparatively close place to a third side which is adjacent to said first side and said second side, and
   said second place and said fifth place each include a comparatively close place to a fourth side which is opposed to said third side.

6. The semiconductor device according to claim 3, wherein said first and second sides include adjacent sides to each other.

7. The semiconductor device according to claim 1, wherein
said first and second self arc-extinguishing elements include first and second insulated gate transistors (IGBTs),
said first electrode includes a collector electrode, and
said second electrode includes an emitter electrode.

8. The semiconductor device according to claim 1, wherein
said first and second self arc-extinguishing elements each include a field effect transistor (FET),
said first electrode includes a drain electrode, and
said second electrode includes a source electrode.

* * * * *